(12) United States Patent
Darwish et al.

(10) Patent No.: US 9,000,865 B2
(45) Date of Patent: Apr. 7, 2015

(54) POWER DIVIDING AND POWER COMBINING CIRCUITS

(71) Applicant: U.S. Army Research Laboratory ATTN: RDRL-LOC-I, Adelphi, MD (US)

(72) Inventors: Ali M. Darwish, Overland Park, KS (US); Hingloi Alfred Hung, Bethesda, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 106 days.

(21) Appl. No.: 13/922,980

(22) Filed: Jun. 20, 2013

(65) Prior Publication Data

US 2014/0368297 A1      Dec. 18, 2014

Related U.S. Application Data

(60) Provisional application No. 61/835,688, filed on Jun. 17, 2013.

(51) Int. Cl.
*H01P 5/12* (2006.01)
*H03F 3/68* (2006.01)

(52) U.S. Cl.
CPC ........................ *H03F 3/68* (2013.01)

(58) Field of Classification Search
USPC .................. 327/4, 5, 100, 136, 137
See application file for complete search history.

(56) References Cited

U.S. PATENT DOCUMENTS

| | | | |
|---|---|---|---|
| 2,877,427 A | | 3/1959 | Butler |
| 4,323,863 A | * | 4/1982 | Weber ........................ 333/109 |
| 6,121,853 A | * | 9/2000 | London ....................... 333/125 |
| 8,346,189 B2 | * | 1/2013 | Dupuy et al. .............. 455/114.1 |
| 2003/0016096 A1 | * | 1/2003 | Higgins et al. ............... 333/124 |
| 2011/0260771 A1 | * | 10/2011 | Hirota et al. ................. 327/360 |

* cited by examiner

*Primary Examiner* — William Hernandez
(74) *Attorney, Agent, or Firm* — Eric B. Compton

(57) ABSTRACT

Power-dividing and/or power-combining circuits have inputs, outputs, at least three electrical pathways, and at least three electronic devices, such as amplifiers, with substantially equal input and output reflection At least one of the electronic devices is in each of the electrical pathways. In one embodiment, multiple phase shift components, such as delay lines, are electrically connected to the electronic devices in each of the electrical pathways. These phase shift components are selected so that a vector sum of the reflected signals from the electronic devices to the inputs and/or the outputs is substantially minimized. In another embodiment, a serial bus extends from the inputs/outputs and at least three pathways in the circuit. The serial bus includes serially-connected impedance-providing components positioned among at least three pathways with the impedance-providing components increasing in impedance from one end to the other end of the serial bus in an amount sufficient to produce a substantially equal amount of power to each of the electronic devices and to substantially minimize input and output reflections.

19 Claims, 3 Drawing Sheets

POWER DIVIDING AND POWER COMBINING CIRCUITS

CROSS REFERENCE TO RELATED APPLICATION(S)

The present application claims the benefit of U.S. Provisional Patent Application No. 61/835,688 filed Jun. 17, 2013, herein incorporated by reference in its entirety for all purposes.

GOVERNMENT INTEREST

The invention described herein may be manufactured, used, and licensed by or for the United States Government without the payment of royalties thereon.

BACKGROUND OF THE INVENTION

I. Field of the Invention

The present invention relates generally to electronic circuits and, more particularly, to power-dividing and/or power-combining circuits.

II. Description of Related Art

Millimeter wave communication, radar, electronic warfare systems, also known as microwave systems, conventionally use amplifiers to increase the power output signal level. An increase in the output power for the microwave system achieves many advantages, e.g. improved operating range, improved communications, and the like.

In order to amplify the microwave transmission signal, conventionally the signal is divided by a splitter having one input and two outputs so that one output signal is coupled as an input signal to one amplifier while the other output signal is connected as an input signal to the other amplifier. The outputs from the amplifiers are then connected to a combiner so that the output signal from the combiner is equal to the input signal amplified by the two amplifiers minus any losses in the splitter or combiner.

Furthermore, the splitter, also known as a divider, is identical to a combiner, but used in the reverse direction. For example, a splitter or divider would have one input and two outputs while the combiner has two inputs and one output so that the divider component is a mirror image of the combiner component. For that reason, the term "combiner/divider" is used interchangeably since a divider may be used either as a divider or a combiner depending upon the fashion in which it is connected to the amplifier circuit.

In order to achieve efficient power amplifier designs for microwave communications, it is critical that the path length from the outputs of the splitter and to the inputs of the combiner be equal. Otherwise, the signals from the amplifiers do not add constructively and power is lost. Likewise, it is necessary that the phase shift, if any, from the outputs of the splitter and to the inputs of the combiner be the same for each amplifier in order for the power output signals from the amplifiers to add or combine constructively.

One inherent problem with power signal level amplification in microwave systems is that the power amplifiers located between the divider and the combiner each exhibits an input reflection coefficient so that a portion of the signal provided by the divider to the power amplifier is reflected back to the input of the power amplifier circuit. This reflected signal effectively reduces the overall power input to the power amplifiers. This, in turn, reduces the overall efficiency of the power amplifier.

In order to reduce the adverse effects of the reflected power from the power amplifiers, there have been previously known balanced microwave power amplifier circuits which eliminated, or at least greatly reduced, the adverse effect of reflected power from the power amplifiers. These previously known balanced amplifier circuits included a first phase delay of 90° in between the divider output and the first amplifier while the output from the first amplifier was connected as an input signal to the combiner. Conversely, the input of a second amplifier was connected directly to a second output from the divider while the output from the second amplifier was electrically connected through a 90° phase shift delay line to a second input of the combiner. In operation, and assuming that both amplifiers are identical in operation to each other, a reflected signal from the first amplifier exhibits a phase shift of 180° at the output from the divider since the signal ultimately resulting in the reflected signal passes through the 90° delay line twice. Conversely, the phase of the reflection from the second amplifier back to the divider exhibits 0° phase shift, relative to the one reflected from the first amplifier. Since the magnitudes of the reflected signals from both amplifiers are equal, the reflected signals from the two amplifiers cancel each other.

These previously known balanced combiner microwave power amplifier circuits, however, have been limited to a two amplifier configuration between the divider and the combiner. In many situations, however, a simple two amplifier circuit produces insufficient output power for the microwave system.

In some circumstances, it may be possible to cascade two or more balanced power amplifier circuits together to increase the overall power output of the microwave system. However, the addition of extra divider/combiner pairs, each having a pair of power amplifiers electrically connected there between, increases the overall size and bulk of the microwave power system. In many situations, such as microwave/millimeter wave integrated circuits (MMICs), the cascading of multiple balanced pairs of amplifiers is simply impractical due to the limited space available on the MMIC substrate.

SUMMARY OF THE PRESENT INVENTION

The present invention provides power-dividing and/or power-combining circuits having at least three electronic devices that overcome all of the above-mentioned disadvantages of the previously-known power amplifier circuits or other similar circuits.

In one embodiment, a power-dividing and/or power-combining circuit may include: one or more inputs, one or more outputs, at least three electrical pathways, and at least three electronic devices with substantially equal signal reflection between the one or more inputs and the one or more outputs. At least one electronic device is provided in each of the electrical pathways. A plurality of phase shift components are further provided with at least one phase shift component electrically connected in series with the electronic devices in each of the electrical pathways. The phase shift components are selected so that a vector sum of the reflected signals from the electronic devices to the one or more inputs and/or the one or more outputs is substantially minimized.

Circuits according this embodiment may be configured as: (i) a divider having one input and a plurality of outputs, and a splitter generating inputs to the pathways from the one input, with outputs from the pathways providing the plurality of outputs; (ii) a combiner having a plurality of inputs and one output, and an adder generating the one output from outputs from the pathways, with inputs to the pathways providing the plurality of inputs; or (iii) a divider/combiner having one input and one output, a splitter generating inputs to the pathways from the one input, and an adder generating the one output from outputs from the pathways. When configured as (iii) a power divider/combiner the total signal phase shift between the multiple paths as measured between the one input and the one output is substantially equal to zero.

Depending of the particular circuit application, the electronic devices may include amplifiers, switches, attenuators, mixers, antenna elements (e.g., phased-array elements), etc. For example, in a three amplifier system embodiment, the input of one amplifier is connected directly to the output from the divider while a phase shift component equal to 120° is electrically connected in series from the output of the first amplifier and to a first input of the combiner. For the second amplifier, a 60° phase shift component is electrically connected in between both the input to the second amplifier and the output from the divider as well as between the output from the second amplifier and a second input to the combiner. Lastly, a phase shift component of 120° is electrically connected between the third output from the divider and the input of the third amplifier while the output from the third amplifier is connected, with no additional phase delay, as an input signal to the third input of the combiner.

In the operation of the three amplifier system, and assuming ideal operation of the amplifiers and also that the amplifiers are identical in operation to each other, a portion of the input signal is reflected by the first amplifier back to the input which is in phase with the incoming signal. Conversely, the reflected signal from the second amplifier at the input is equal in magnitude, but offset 120° from the reflected signal from the first amplifier. Similarly, the third amplifier reflects a signal equal in amplitude to the reflected signals of both the first and second amplifiers, but with a phase shift of 240°.

Since the reflected signals from the amplifiers at the input to the power amplifier circuit are equal in amplitude, but angularly offset from each other by 120°, these three reflected vector signals, when combined, cancel and thus eliminate, or at least minimize, signal loss at the input to the power amplifier circuit.

For circuits containing four or more electronic devices, the actual selection of the delay component will differ in order to produce a reflected signal at the input which vectorally cancels thus resulting in zero or at least low signal loss.

In another embodiment, a power-dividing and/or power-combining circuit may include: one or more inputs, one or more outputs, at least three electrical pathways, and at least three electronic devices with substantially equal signal reflection between the one or more inputs and the one or more outputs. At least one electronic device is provided in each of the electrical pathways. A serial bus extends from the one or more input and the one or more outputs, the serial bus having serially connected impedance-providing components, positioned between the electrical pathways, the impedance-providing components increasing in impedance from one end and to the other end of the serial bus in an amount sufficient to produce a substantially equal amount of power to each of at least three electronic devices.

Circuits according this embodiment may be configured as: (i) a divider having one input and a plurality of outputs, wherein the serial bus generates inputs to the pathways from the one input, with outputs from the pathways providing the plurality of outputs; (ii) a combiner having a plurality of inputs and one output, wherein the serial bus generates the one output from outputs of the pathways, with inputs to the pathways providing the plurality of the inputs; or (iii) a divider/combiner having one input and one output, wherein a first of the serial bus generates inputs to the multiple pathways from the one input, and a second of the serial bus generates the one output from outputs from the multiple paths. When configured as (iii) the combiner/divider, the total signal phase shift between the multiple paths as measured at the one input and the one output is substantially equal to zero.

BRIEF DESCRIPTION OF THE DRAWING

A better understanding of the present invention will be had upon reference to the following detailed description when read in conjunction with the accompanying drawing, wherein like reference characters refer to like parts throughout the several views, and in which.

DETAILED DESCRIPTION

In general, the power-dividing and/or power-combining circuits described herein have inputs, outputs, at least three electrical pathways, and at least three electronic devices between the inputs and the outputs. At least one electronic device may be provided in each of the electrical pathways. Depending on the configuration of the inputs, outputs, the pathways and the electronic devices may be connected in parallel between the inputs and outputs. The electronic devices have substantially equal signal reflection at the inputs and/or the outputs. For example, the electronic devices may have input reflection coefficients and substantially equal output reflection coefficients. While the embodiments illustrated in the figures generally show a power amplifier as an electronic device, it should be appreciated that the circuits may include other electronic devices as well. For instance, the electronic devices may include amplifiers, switches, attenuators, mixers, antenna elements (e.g., phased-array elements), etc.

Figure 1:
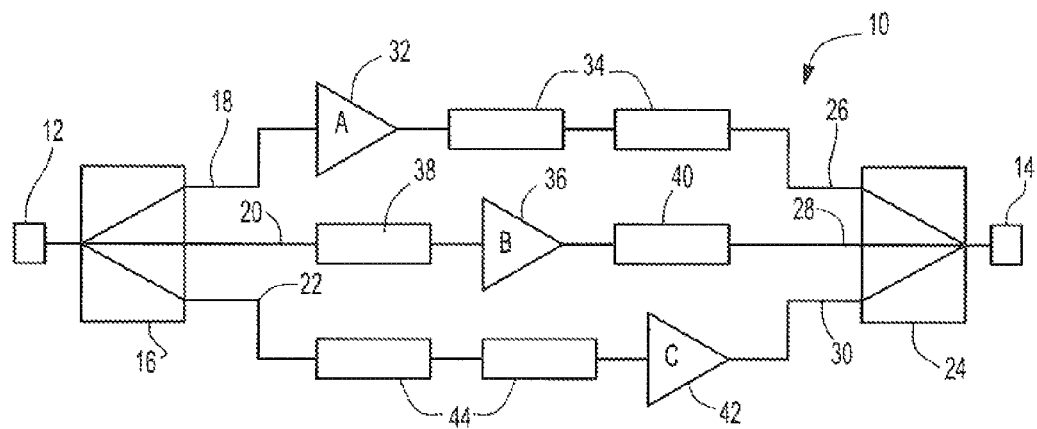
FIG. 1 is a block diagrammatic view of a circuit containing three power amplifiers and multiple phase shift components connected in series with each of the electronic devices according to an embodiment.

FIG. 1 is a block diagrammatic view of a circuit containing three power amplifiers and multiple phase shift components connected in series with each of the electronic devices according to an embodiment. As will be appreciated, multiple phase shift components are provided with at least one phase shift component electrically connected in series with the electronic devices in each of the electrical pathways. The phase shift components are selected so that a vector sum of the reflected signals from the electronic devices to the one or more inputs and/or the one or more outputs is substantially minimized.

With reference first to FIG. 1, a millimeter wave, e.g. 32 gigahertz, power amplifier circuit 10 is illustrated. It should be appreciated that the amplifier circuit 10 may be used for other frequency bands and applications. The circuit 10 may be configured for operation in the frequency range 0.1-1000 GHz in some instances. Here, the circuit 10 is configured as both a power-divider and a power-combiner. More particularly, the power amplifier circuit 10 includes both a power input 12 as well as a power output 14 with multiple electrical pathways (e.g., three as illustrated) provided between the power input 12 and the power output 14 including respective electronic devices. The entire power amplifier circuit 10 may be implemented as an MMIC in some embodiments.

The power-dividing portion of the circuit 10 includes the power input 12 connected to a signal splitter 16 which splits an input signal to input 12 into three inputs 18, 20, and 22 to the multiple pathways including the electronic devices, such as amplifiers 32, 36, and 42. Ideally, the splitter 16 evenly divides the input signal to the power input 12 so that the power signal levels at each of inputs 18, 20, and 22 to the multiple pathways are not only equal in magnitude, but also equal in phase to each other. If inputs 18, 20, and 22 are separately desired or provided for in the circuit, a splitter element dividing an input signal into multiple signals may not be needed. Ideally, the signal splitter 16 exhibits a constant phase shift of the signals between power input 12 and the inputs 18, 20 and 22 to the multiple pathways and, likewise, introduces negligible signal loss for the circuit 10.

Similarly, the power-combining portion of the circuit 10, has a signal adder 24 which receives signals from three outputs 26, 28, and 30 of the multiple pathways and combines them into single signal for output at the power output 14. If separate outputs are desired or provided for in the circuit, an adder element combining the outputs 26, 28, and 30 into one output signal may not be needed.

Ideally, the signal adder 24 exhibits a constant phase shift of the signals between outputs 26, 28, and 30 of the multiple pathways and the power output 14 and, likewise, introduces negligible signal loss for the circuit 10. Furthermore, the adder 24 may be identical to the splitter 16 but electrically connected in the reverse direction. In some embodiments, splitter 16 and adder 24 may be conventional elements.

Still referring to FIG. 1, a first amplifier 32 has its input connected to the first output 18 from the splitter 16. The output from the first amplifier 32 is then connected through two 60° phase shift components 34 which are connected in series from the output from the amplifier 32 and to the first input 26 of the adder 24. Alternatively, a single phase shift component of 120° may be substituted for the two series phase shift components 34.

A second amplifier 36 is connected in series with the second output 20 from the divider through a 60° phase shift component 38. The output from the second amplifier 36 is connected through a 60° phase shift component 40 to the second input 28 of the adder 24.

Lastly, a third amplifier 42 has its input connected through two 60° phase shift components 44 to the third output 22 from the splitter 16. The output from the third amplifier 42 is connected to the third input 30 of the adder 24.

Ideally, the three amplifiers 32, 36, and 42 are identical, or substantially identical, to each other so that all three amplifiers 32, 36, and 42 exhibit substantially identical signal reflection due to impedance mismatch at the input of each amplifier 32, 36, and 42. Additionally, the phase shift components 34, 38, 40, and 44 may take any construction, but preferably are in the form of a signal delay line.

Figure 2:
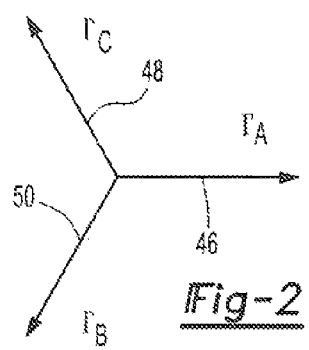
FIG. 2 is a vector diagram illustrating the reflected power at the input.

With reference now to FIGS. 1 and 2, in operation, the signal on the input 12 to the circuit is divided into three inputs 18, 20, and 22 of equal power and same phase to the multiple pathways. Due to the impedance mismatch at the first amplifier 32, a portion of the signal is reflected by the first amplifier 32 back to the input 12. This reflected signal is illustrated by vector 46 having a magnitude or length, and a phase shift of 0°, since it is taken as the reference signal.

The output from the first amplifier 32 is connected through the two 60° phase shift components 34 to the adder input 26. Consequently, the total phase shift from the input 18 and to the output 26 equals 120°.

Similarly, one third of the power at the input 12 flows through the phase delay component 38 to the input of the second amplifier 36. A portion of that power is reflected due to impedance mismatch back through the phase shift component 38 and to the input 12. This reflected power is illustrated in FIG. 2 as vector 48. The vector 48 has the same magnitude or length as the first vector 46 (assuming zero signal loss in the phase shift component 38) but is offset in phase by 120° due to the two signal passages through the 60° phase shift component 38.

The output from the second amplifier 36 is connected through a single 60° phase shift component 40 to the second input 28 of the combiner 24. Consequently, the overall phase shift from the input 20 and to the output 28 is equal to 120°, i.e. the same for the first amplifier 32.

Lastly, the signal from the third output 22 of the splitter 16 passes through the two 60° phase delay components 44 and to the input of the third amplifier 42. A portion of that signal is then reflected, due to impedance mismatch, back through the two phase shift components 44 to the input 12 so that the total phase shift for the reflected signal from the third amplifier 42 equals 240°.

The reflected image from the third amplifier 42 is illustrated in FIG. 2 as vector 50. The vector 50 has a magnitude of length the same, or at least substantially the same, as the vectors 46 and 48, but has a phase offset of 240° from the first vector 46. These three vectors 46, 48, and 50, however, when combined, effectively cancel each other both in magnitude as well as in phase. This, in turn, results in essentially zero, or extremely low loss for signal entering the input 12 to the three amplifiers in amplifier circuit 10.

In addition, the overall phase delay from the input 22, through the amplifier 42, and to the output 30 equals 120°, i.e. the same as the other amplifiers 32 and 36. As such, all three signals at the output 14 are in phase with each other at the output 14 for maximum signal strength. Furthermore, even in the event that the amplifiers 32, 36, and 42 introduce a phase delay of φ, the phase shift caused by each amplifier 32, 36, and 42 will be identical so that the signals at the output 14 from the adder 24 remain in phase with each other. By the same token, an introduction of a phase shift φ by the amplifiers 32, 36, and 42 would merely rotate the vector diagram illustrated in FIG. 2 by an angular amount equal to φ but would still result in cancellation of the vectors 46, 48, and 50.

The foregoing example of three amplifiers was by way of example only. Rather, any arbitrary numbers of at least three amplifiers, odd or even, may be used provided that the phase shift components are properly selected, for example, between the splitter and the adder, to produce reflected power signals from the amplifiers which cancel each other.

Figure 3:
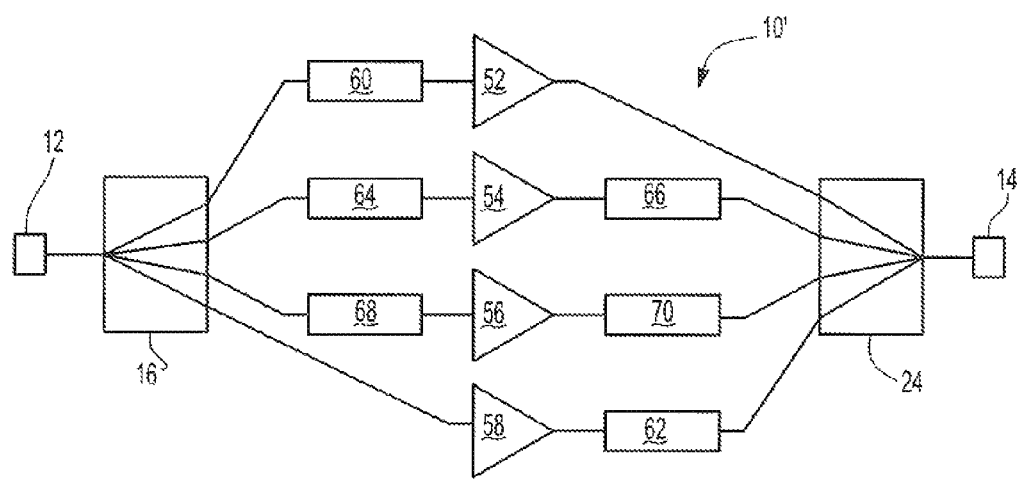
FIG. 3 is a view similar to FIG. 1, but illustrating a four amplifier circuit.

For example, with reference now to FIG. 3, a power amplifier circuit 10' having four amplifiers, namely a first amplifier 52, second amplifier 54, third amplifier 56, and fourth amplifier 58, is shown interconnected between an input 12 and output 14 of the power amplifier circuit 10'.

A 135° phase delay circuit 60 is connected between the input to the first amplifier 52 and the signal splitter 16 while the output from the first amplifier 52 is connected to the signal added 24. The opposite is true for the fourth amplifier 58, i.e.

the input of the fourth amplifier 58 is connected to the splitter while its output is connected through a 135° phase shift component 62 to the adder 24.

A 90° phase shift component 64 is connected between the splitter 16 and the input of the second amplifier 54 while the output from the second amplifier 54 is connected through a 45° phase shift component 66 to the combiner 24. Lastly, a 45° phase shift component 68 is connected between the splitter 16 and input to the third amplifier 56 while the output from the third amplifier 56 is connected through a 90° phase shift component 70 to the adder 24.

Figure 4:
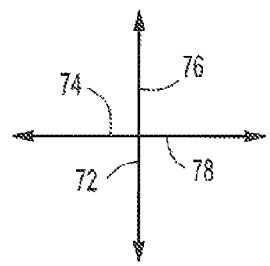
FIG. 4 is a view similar to FIG. 2, but illustrating the vector diagram for the circuit of FIG. 3.

Consequently, and with reference to FIGS. 3 and 4, a portion of the signal from the input 12 is reflected by the first amplifier 52 back to the input. That reflected signal passes through the 135° phase shift component 60 thus producing a total phase shift of 270° and a magnitude illustrated by the length of the vector 72 in FIG. 4. Similarly, a portion of the signal from the input 12 to the second amplifier 54 passes through the 90° phase shift component 64 twice thus resulting in a 180° phase shift illustrated at vector 74 in FIG. 4.

Similarly, a portion of the signal from the input is reflected by the third amplifier 56 twice through the 45° phase shift component 68 thus resulting in a 90° phase shift illustrated by vector 76 in FIG. 4. The signal reflected back to the input 12 by the fourth amplifier 58 has no phase shift and thus results in a vector 78 in FIG. 4 having a zero phase shift.

Ideally, the amplifiers 52, 54, 56, and 58 (or other electronic devices) are all identical to each other so that the magnitude of the reflected signal back to the input 12 is identical for each amplifier and represented by the length of each vector 72-78. The vectors 72-78 when added or combined together completely cancel out thus resulting in substantially zero power loss. Furthermore, the phase shift components 66, 70, and 62 which are connected between the amplifiers 54, 56, and 58 and the combiner 24 ensure that the total phase shift between the input 12 and output 14 for the power amplifier circuit 10' remains the same or, approximately, 135° plus any phase shift φ resulting from the amplifier itself.

In order to adjust the phase shift amount of the phase shift components for N electronic devices (e.g., amplifiers), the amount of phase shift for each sequential amplifier equals 1×(180/N), 2×(180/N), 3×(180/N) . . . (N−1)×(180/N). Or put another way, where the circuit includes N electronic devices and at least N−1 signal delay line components connected in series with the N electronic devices, power reflected from each electronic device to the input should exhibits a phase shift of 180/N degrees or a multiples thereof with respect to other electronic devices.

Figure 5:
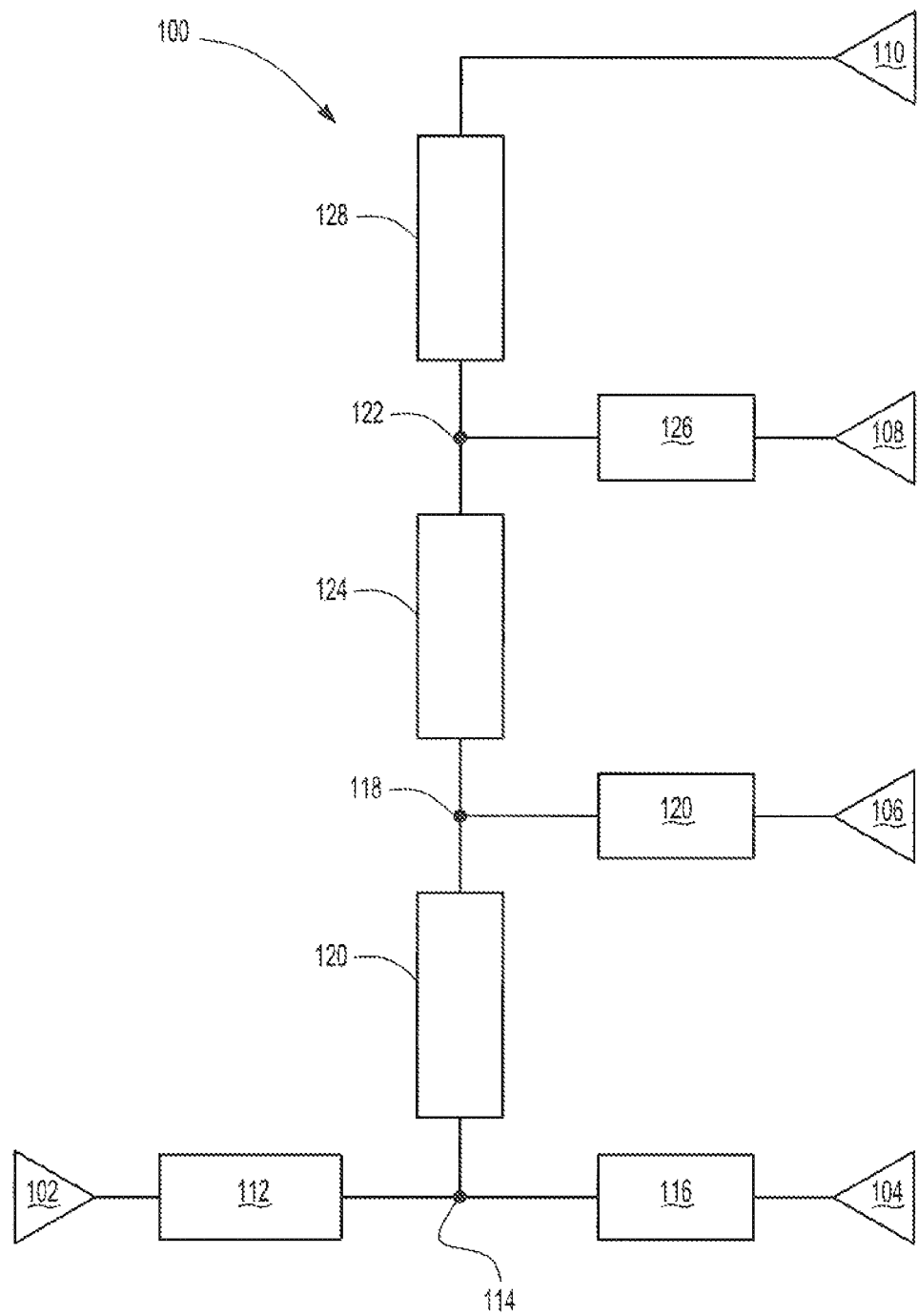
FIG. 5 is a block diagrammatic view of a circuit including a serial bus having serially connected impedance-providing components which increase in impedance from one end and to the other end according to another embodiment.

FIG. 5 is a block diagrammatic view of a circuit including a serial bus having serially connected impedance-providing components which increase in characteristic impedance values from one end and to the other end according to another embodiment. As will be appreciated, the serial bus having serially connected impedance-providing components is positioned between an input and a plurality of outputs in the when used for power-dividing (or in a reversed configuration when used for power-combining), the impedance-providing components increasing in impedance from one end and to the other end of the serial bus in an amount sufficient to produce a substantially equal amount of power to each of at least three electronic devices.

With reference now to FIG. 5, a circuit 100 is configured as a power-divider having one input and a plurality of outputs which provide a plurality of inputs to multiple electrical pathways depending from the serial bus. Here, the serial bus is illustrated for equally dividing a signal at its input 102 into four signals of equal power at its four outputs 104, 106, 108, and 110. The phase shift of the signal varies at each of the output ports 104-110. As will be described subsequently in greater detail, the circuit 100, when configured as a power-dividing circuit, a power-combining circuit or both, automatically corrects these phase shifts.

More specifically, an input signal at the input 102 first passes through a phase shift component 112 having a fixed phase shift, e.g. 90°, and a fixed characteristic impedance, e.g. 25 ohms, to a common node 114. Power from the common node 114 then provides power to all four outputs 104, 106, 108, and 110. The outputs 104, 106, 108, and 110 may subsequently provide inputs to electrical pathways having electronic devices, such as amplifiers, as further illustrated in FIG. 6.

In particular, the node 114 is electrically connected to the first output 104 by an impedance component 116 having a zero phase shift and a fixed impedance of 50 ohms. The node 114 is then connected to a node 118 by a phase shift component 120 having a fixed phase shift of 45° and an impedance of 16.6 ohms. Since the characteristic impedance of the phase shift component 120 is one third of the characteristic impedance of the phase shift component 116, one quarter of the power from the node 114 flows to the first outlet 104 while three quarters of the power from the node 114 flows to the node 118.

The node 118 is connected by an impedance component 120 having impedance of 50 ohms and a zero phase shift to the second output 106. The node 118 is also connected to a node 122 by a phase shift component 124 having a phase shift of 45° and an impedance of 25 ohms. Since the impedance of the phase shift component 124 is one half the impedance of the impedance component 120, one third of the power from the node 118 passes to the output 106 while two thirds of the power passes through the phase shift component 124 to the node 122.

The node 122 is connected to the third outlet 108 through an impedance component 126 having an impedance of 50 ohms and a zero phase shift. The node 122 is also connected to the first outlet 110 by a phase shift component 128 having a phase shift of 45° and an impedance of 50 ohms. Since the phase shift component 128 has the same impedance as the impedance component 126, the power at node 122 is evenly divided between the third outlet 108 and fourth outlet 110.

Consequently, it can be seen that the serial bus 100 evenly distributes power from its input 102 to its four outputs 104, 106, 108, and 110. However, as described below, the signals at the divider outputs are phase shifted relative to each other.

Figure 6:
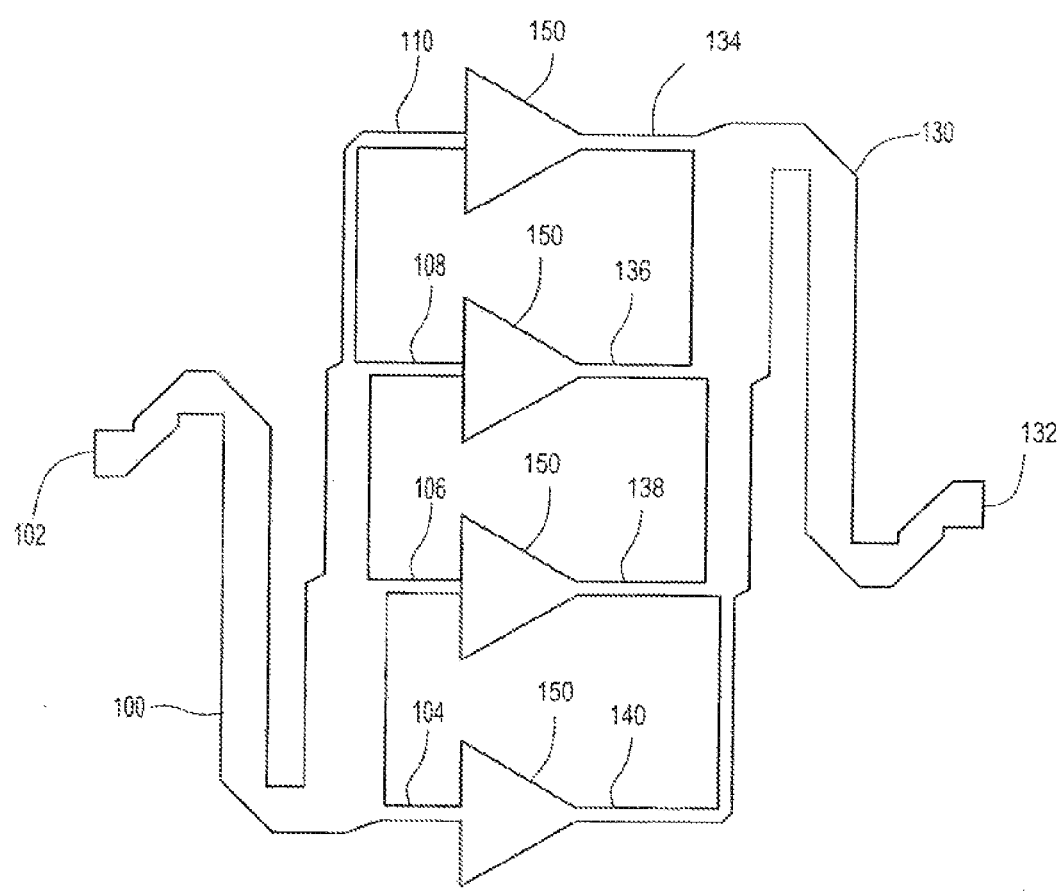
FIG. 6 is a view of a power amplifier system using the circuit illustrated in FIG. 5.

With reference now to FIG. 6, a circuit is illustrated which is configured as a divider/combiner. Here, the circuit 100 of FIG. 5 is shown as a signal divider 100 for the power-dividing portion of the circuit having an input 102, and also as a signal combiner 130 for the power-combining portion of the circuit having an output 132. The circuit illustrated in FIG. 6 thus is configured as a divider/combiner having one input 102 and one output 132. A first serial bus 100 generates inputs to the multiple pathways from the one input 102, and a second serial bus 130 generates the one output 132 from outputs from the multiple paths. In this configuration, the total signal phase shift between the multiple paths as measured at the one input and the one output is substantially equal to zero.

It should be appreciated though that the power-dividing and power-combining portions of the circuit may be similarly function as stand-alone circuits in other embodiments. For instance, a power-dividing circuit may have one input and a plurality of outputs, where the serial bus 100 generates inputs to the pathways from the one input 102, with outputs from the pathways providing the plurality of outputs. And a power-combing circuit may have a plurality of inputs and one output 132, where the serial bus 130 generates the one output 132 from outputs of the pathways, with inputs to the pathways providing the plurality of the inputs.

When the serial bus is employed as a combiner 130, the inputs 104, 106, 108, and 110 illustrated in FIG. 5 now act as signal outputs 134, 136, 138, and 140, respectively. It is noted that the combiner 130 may be thought of as being oriented "upside-down" with respect to the divider 100 in FIG. 6 so as to be function in a reversed manner. Four power amplifiers 150 are located along the four electrical pathways between the divider 100 and combiner 130 so that one power amplifier 150 is electrically connected between the divider output 110 and the combiner input 134 while one amplifier 150 is connected between the divider output 108 and the combiner input 136. Similarly, one amplifier 150 is electrically connected between the divider output 106 and the combiner input 138 while one amplifier 150 is electrically connected between the divider output 104 and the combiner input 140. Ideally, all four amplifiers 150 are identical in operation to each other.

With reference now to both FIGS. 5 and 6, the phase shift of a reflection from the amplifier 150 at the node 114 from the divider output 104 will equal a zero phase shift and thus result in the vector 78 illustrated in FIG. 4. Each impedance-providing component may be configured to create a phase shift equal to 180°/N or a multiple thereof, where N equals the number of electronic devices.

The power that is reflected by the amplifier 150 through the second divider output 106 passes twice through the phase shift component 120 (FIG. 5) thus resulting in an overall phase shift of 90° corresponding to vector 76 in FIG. 4. Similarly, the reflected power from the amplifier 150 from the third divider output 108 passes through the phase shift components 120 and 124 twice thus resulting in an overall phase shift of 180° as shown by vector 74. Similarly, a reflected signal from the power amplifier 150 through the output 110 passes twice through the phase shift components 120, 124, and 128 thus resulting in an overall phase shift of 270° which corresponds to vector 72 in FIG. 4. As before, the vectors 72-78 all cancel each other thus minimizing or eliminating signal reflection from all amplifier at the input 102 with minimal signal power loss input into the amplifiers 150.

In addition to an equal distribution of power by the divider 100, the total phase shift from node 114 (FIG. 5) in the divider 100 to the corresponding node in the combiner 130 is identical for each amplifier path and is equal to 135° plus any phase shift caused by the amplifiers 150. For example, the signal passing from node 114 in the divider 100 through the first output 104 must pass through all three phase shift components 128, 124, and 120 (FIG. 5 when employed as a combiner) in the combiner 130 thus resulting in a total phase shift of 135°.

Phase shift components and components with different impedances have been described for controlling the power distribution and phase shift of the various circuits described herein. In some instances, for example, the phase shift components and/or impedance-providing components may be transmissions lines having a predetermined length, having a characteristic impedance and a predetermined length. Examples of transmission lines may include microstrip lines, striplines, co-planar waveguides, or waveguides. The magnitude and/or phase of the transmission lines may be judiciously selected to provide desired electrical characteristics. For instance, the electronic length of the transmission lines may dictate the phase shift (or delay) of the signal.

For a microstrip line or stripline configuration, the line may have a conductor on top of a ground plane with a dielectric there between. The longer in length of the line the greater delay may be achieved. For a given thickness of the dielectric, the characteristic impedance can be changed by changing the width of the top conductor from a relative base-line (e.g., which may be 50 ohm characteristic impedance). If the conductor is made narrower, the characteristic impedance is increased. Whereas if the conductor is made wider, the characteristic impedance is decreased. And the magnitude of the signal may be dictated by changing the impedance of the transmission line to be different from the input impedance. For a waveguide configuration, the waveguide may be a conventional waveguide (e.g., a standard waveguide size) or a modified/custom form to achieve different wave impedance thereof. And, for a co-planar waveguide (CPW) configuration, the structure may a conventional CPW and/or modified/custom form thereof which includes spacing of different conductors supporting wave propagation located on the same plane on top of a dielectric substrate. The median strip is the signal line and the two surrounding strips serve as grounds. For a waveguide or CPW, changing the dimensions thereof generally changes the characteristic impedance and phase shift as one skilled in the art appreciates. However, it should be appreciated that other phase shifting and impedance-providing means may be used without deviating from the spirit or scope of the invention The power-dividing and/or power-combining circuit embodiments described herein may be applicable for RF-to-submillimeter-wave signals, when used in power amplifier configuration demonstrated minimum reflected signal at the input or output. The technique combines and cancels reflections of multiple (any number) amplifiers. The technique also eliminates the need for expensive, bulky and RF-lossy isolators required at the input/output of conventional power amplifiers, thus reducing system costs.

From the foregoing, it can be seen that the present invention provides a novel power amplifier circuit, as well as an improved divider/combiner for microwave/millimeter-wave circuitry or microwave systems. Having described our invention, however, many modifications thereto will become apparent to those skilled in the art to which it pertains without deviation from the spirit of the invention as defined by the scope of the appended claims.

We claim:

1. A power-dividing and/or power-combining circuit comprising:
   one or more inputs;
   one or more outputs;
   at least three electrical pathways;
   at least three electronic devices with substantially equal signal reflection pathways between said one or more inputs and said one or more outputs, at least one of said electronic devices in each of the electrical pathways; and
   a plurality of phase shift components, at least one phase shift component electrically connected in series with the electronic devices in each of the electrical pathways, said phase shift components being selected so that a vector sum of the reflected signals from the electronic devices to said one or more inputs and/or said one or more outputs is substantially minimized.

2. The circuit as defined in claim 1, being configured as:
   (i) a divider having one input and a plurality of outputs, and a splitter generating inputs to the pathways from the one input, with outputs from the pathways providing the plurality of outputs;

(ii) a combiner having a plurality of inputs and one output, and an adder generating the one output from outputs from the pathways, with inputs to the pathways providing the plurality of inputs; or (iii) a divider/combiner having one input and one output, a splitter generating inputs to the pathways from the one input, and an adder generating the one output from outputs from the pathways.

3. The circuit as defines in claim 2, wherein when configured as (iii) the power divider/combiner the total signal phase shift between the pathways as measured between the one input and the one output is substantially equal to zero.

4. The circuit as defined in claim 1, wherein said electronic devices comprise: amplifiers, switches, attenuators, mixers, or antenna elements.

5. The circuit as defined in claim 1, wherein said phase shift component comprises a signal delay line.

6. The circuit as defined in claim 5, wherein said circuit includes N electronic devices and at least N−1 signal delay line components connected in series with said N electronic devices so that power reflected from each electronic device to said input exhibits a phase shift of 180/N degrees or a multiples thereof with respect to two other electronic devices.

7. The circuit as defined in claim 1, wherein the phase shift components are transmissions lines having a predetermined length.

8. The circuit as defined in claim 7, wherein the transmission lines are microstrip lines, striplines, co-planar waveguides, or waveguides.

9. The circuit as defined in claim 1, wherein said circuit is configured as an MMIC.

10. The circuit as defined in claim 1, wherein said circuit operates in the frequency range 0.1-1000 GHz.

11. A power-dividing and/or power-combining circuit comprising:
   one or more inputs;
   one or more outputs;
   at least three electrical pathways;
   at least three electronic devices with substantially equal signal reflection between said one or more inputs and said one or more outputs, at least one of said electronic devices in each of the electrical pathways; and
   a serial bus extending from said one or more inputs and said one or more outputs, said serial bus having serially-connected impedance-providing components positioned between said electrical pathways, said impedance-providing components increasing in impedance from one end and to the other end of said serial bus in an amount sufficient to produce a substantially equal amount of power to each of at least three electronic devices and to produce substantially minimized reflection at the one or more inputs and the one or more outputs.

12. The circuit as defined in claim 11, being configured as:
(i) a divider having one input and a plurality of outputs, wherein the serial bus generates inputs to the pathways from the one input, with outputs from the pathways providing the plurality of outputs;

(ii) a combiner having a plurality of inputs and one output, wherein the serial bus generates the one output from outputs of the pathways, with inputs to the pathways providing the plurality of the inputs; or (iii) a divider/combiner having one input and one output, wherein a first of said serial bus generates inputs to the pathways from the one input, and a second of said serial bus generates the one output from outputs from the pathways.

13. The circuit as defines in claim 12, wherein when configured as (iii) the combiner/divider, the total signal phase shift between the pathways as measured between the one input and the one output is substantially equal to zero.

14. The circuit as defined in claim 11, wherein said electronic devices comprise: amplifiers, switches, attenuators, mixers, or antenna elements.

15. The circuit as defined in claim 11, wherein the impedance-providing components are transmissions lines have a characteristic impedance and a predetermined length.

16. The circuit as defined in claim 15, wherein the transmission lines are microstrip lines, striplines, co-planar waveguides, or waveguides.

17. The circuit as defined in claim 11, wherein each impedance-providing component creates a phase shift equal to 180/N or a multiple thereof, where N equals the number of electronic devices.

18. The circuit as defined in claim 11, wherein said circuit is configured as an MMIC.

19. The circuit as defined in claim 11, wherein said circuit operates in the frequency range 0.1-1000 GHz.

* * * * *